(12) United States Patent
Lazaro et al.

(10) Patent No.: US 11,362,587 B2
(45) Date of Patent: Jun. 14, 2022

(54) HYSTERETIC PULSE MODULATION FOR CHARGE BALANCE OF MULTI-LEVEL POWER CONVERTERS

(71) Applicant: Texas Instruments Incorporated, Dallas, TX (US)

(72) Inventors: Orlando Lazaro, Dallas, TX (US); Kevin Scoones, San Jose, CA (US); Alvaro Aguilar, Irving, TX (US); Jeffrey Anthony Morroni, Parker, TX (US); Sombuddha Chakraborty, Redwood City, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/858,640

(22) Filed: Dec. 29, 2017

(65) Prior Publication Data
US 2019/0058385 A1    Feb. 21, 2019

Related U.S. Application Data

(60) Provisional application No. 62/545,638, filed on Aug. 15, 2017.

(51) Int. Cl.
| H02M 3/158 | (2006.01) |
| H02M 1/14 | (2006.01) |
| H02M 3/07 | (2006.01) |
| H03K 7/08 | (2006.01) |

(52) U.S. Cl.
CPC ............. *H02M 3/158* (2013.01); *H02M 1/14* (2013.01); *H02M 3/07* (2013.01); *H03K 7/08* (2013.01)

(58) Field of Classification Search
CPC .......... H02M 1/08; H02M 1/088; H02M 1/14; H02M 3/158; H02M 3/156; H02M 3/1582; H02M 3/1588; H02M 2001/0009; H02M 2001/0025; H03K 7/08; H03C 2200/0045
See application file for complete search history.

(56) References Cited

U.S. PATENT DOCUMENTS

| 5,892,450 | A | 4/1999 | Scoones | |
| 7,764,526 | B1 * | 7/2010 | Xing | ........................ H02M 3/07 363/62 |
| 9,083,230 | B2 | 7/2015 | Narimani et al. | |
| 9,160,232 | B2 | 10/2015 | Thomas et al. | |
| 9,325,252 | B2 | 4/2016 | Narimani et al. | |
| 9,520,800 | B2 | 12/2016 | Tian et al. | |

(Continued)

OTHER PUBLICATIONS

International Search Report for PCT/US2018/000233 dated Dec. 20, 2018.

*Primary Examiner* — Gustavo A Rosario-Benitez
(74) *Attorney, Agent, or Firm* — Valerie M. Davis; Charles A. Brill; Frank D. Cimino

(57) ABSTRACT

In described examples of methods and control circuitry to control a multi-level power conversion system, the control circuitry generates PWM signals having a duty cycle to control an output signal. The duty cycle is adjustable in different switching cycles. States of the system's switches are adjustable in one or more intervals within the switching cycles. In response to a voltage across a capacitor of the system being outside a non-zero voltage range, the control circuitry adjusts states of the switches in two intervals to discharge or charge the capacitor in a given switching cycle.

17 Claims, 7 Drawing Sheets

(56) References Cited

U.S. PATENT DOCUMENTS

| | | | |
|---|---|---|---|
| 9,559,541 B2 | 1/2017 | Cheng et al. | |
| 9,748,862 B2 | 8/2017 | Cheng et al. | |
| 9,806,604 B2* | 10/2017 | Delos Ayllon | H05B 45/3725 |
| 9,866,113 B1* | 1/2018 | Assaad | H02M 3/158 |
| 9,929,653 B1 | 3/2018 | Mercer | |
| 10,050,515 B1 | 8/2018 | Chakraborty | |
| 10,090,763 B1* | 10/2018 | Mercer | H02M 3/1582 |
| 2010/0253313 A1 | 10/2010 | Herzer | |
| 2010/0308784 A1 | 12/2010 | Scoones et al. | |
| 2011/0018511 A1 | 1/2011 | Carpenter | |
| 2011/0199057 A1 | 8/2011 | Ivanov et al. | |
| 2011/0235831 A1* | 9/2011 | Kaiho | H03F 3/2173 381/190 |
| 2011/0316503 A1 | 12/2011 | Huang | |
| 2012/0098512 A1 | 4/2012 | Kirchner | |
| 2013/0334987 A1* | 12/2013 | Garg | B06B 1/0238 318/116 |
| 2014/0232364 A1* | 8/2014 | Thomas | H02M 7/483 323/271 |
| 2014/0266099 A1* | 9/2014 | Ku | G05F 1/56 323/273 |
| 2015/0194902 A1* | 7/2015 | Tian | H02M 5/458 363/37 |
| 2015/0207401 A1* | 7/2015 | Zhang | H02M 3/158 323/271 |
| 2015/0340952 A1 | 11/2015 | Manohar | |
| 2016/0013713 A1* | 1/2016 | Li | H02M 3/158 323/312 |
| 2016/0118886 A1* | 4/2016 | Zhang | H02M 3/158 323/271 |
| 2016/0254745 A1 | 9/2016 | Lim et al. | |
| 2016/0254746 A1 | 9/2016 | Lerdworatawee | |
| 2016/0299554 A1 | 10/2016 | Kumar | |
| 2016/0301303 A1 | 10/2016 | Bari | |
| 2016/0315539 A1 | 10/2016 | Lee | |
| 2016/0373002 A1 | 12/2016 | Borfigat | |
| 2017/0126120 A1 | 5/2017 | Chakraborty et al. | |
| 2017/0149335 A1 | 5/2017 | Morroni | |
| 2017/0256950 A1 | 9/2017 | Kuai | |
| 2018/0006552 A1* | 1/2018 | Delos Ayllon | H02M 1/088 |
| 2018/0006559 A1 | 1/2018 | Chen | |
| 2018/0034364 A1 | 2/2018 | Nakada et al. | |
| 2018/0294717 A1* | 10/2018 | Zhang | H02M 3/073 |

* cited by examiner

HYSTERETIC PULSE MODULATION FOR CHARGE BALANCE OF MULTI-LEVEL POWER CONVERTERS

CROSS-REFERENCE TO RELATED APPLICATIONS

This application claims priority to, and the benefit of, U.S. Provisional Patent Application No. 62/545,638, entitled "Hysteretic Pulse Modulation for Charge Balance of Multi-Level Power Converters", filed Aug. 15, 2017, the entirety of which is hereby incorporated by reference. This application is related to co-assigned patent application Ser. No. 15/858,626, entitled "HARMONIC MODULATION FOR CHARGE BALANCE OF MULTI-LEVEL POWER CONVERTERS", filed Dec. 29, 2017, the entirety of which is hereby incorporated by reference. This application is related to co-assigned patent application Ser. No. 15/858,648, entitled "REGULATED SUPPLY FOR POWER CONVERSION SYSTEM CONTROL CIRCUITRY", filed on Dec. 29, 2017, the entirety of which is hereby incorporated by reference.

BACKGROUND

High efficiency power supplies are desirable for battery-operated systems, including mobile phones, tablets, laptops and other user devices. Buck, boost and other two-level DC to DC converters use high and low side drivers to alternately connect a switching node to the input voltage or ground. As a result, the high and low side drivers are sized to withstand the input voltage level, and suffer from high switching losses. Three-level and higher order switching converter circuits use more switching transistors and one or more flying capacitors, resulting in higher effective switching frequency and reduced switching loss. These higher level converters can provide higher power density, with reduced voltage withstanding requirements of the converter switches. However, efficient operation of three-level and higher order switching converters requires charge balance and voltage stability for the flying capacitor. Mismatch in the switching on time causes the flying capacitor voltage to drift. Even with equal charging and discharge times, offsets in the flying capacitor voltage remain. The flying capacitor voltage can be maintained and voltage misbalances can be adjusted by altering the converter duty cycle. For example, one phase can be modulated to regulate the flying capacitor voltage, and the other can be used for output regulation. However, this slows the output regulation loop and transient response is poor. Moreover, this disturbs the output control loop and can lead to asymmetric inductor currents or instability. Valley-mode control can be used to regulate the flying capacitor voltage, but valley-mode control does not work for voltage conversion ratios approaching unity. These flying capacitor voltage mismatch shortcomings prevent or inhibit the ability to realize the benefits of three-level and higher order converters for high efficiency switching power supply applications.

SUMMARY

In described examples of methods and control circuitry to control a multi-level power conversion system, the control circuitry generates pulse width modulated signals having a duty cycle to control an output signal. The duty cycle is adjustable in different switching cycles. States of the system's switches are adjustable in one or more intervals within the switching cycles. In response to a voltage across a capacitor of the system being outside a non-zero voltage range, the control circuitry adjusts states of the switches in two intervals to discharge or charge the capacitor in a given switching cycle.

DETAILED DESCRIPTION

Figure 1:
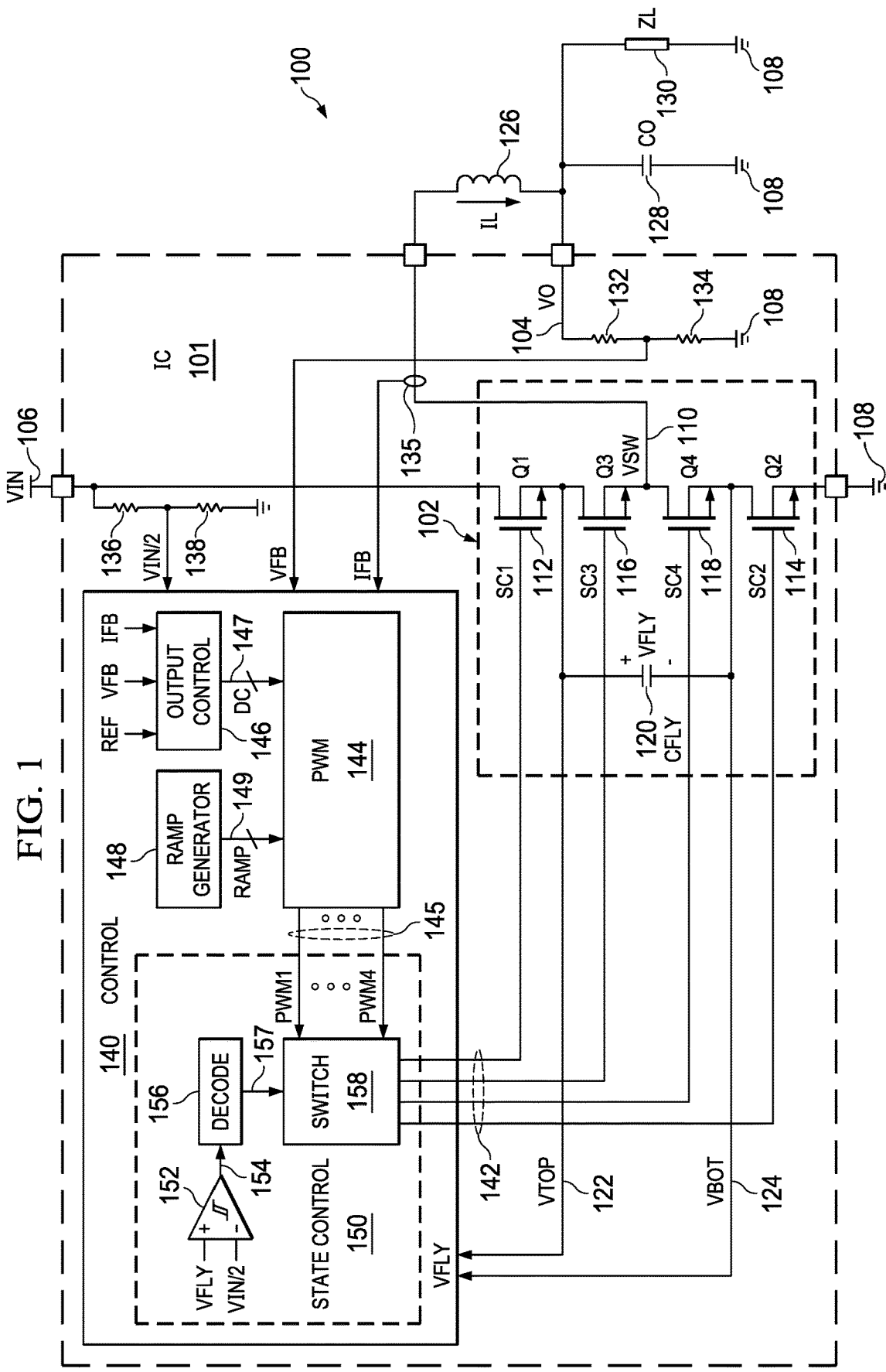
FIG. 1 is a system diagram of a multi-level power conversion system.

In the drawings, like reference numerals refer to like elements throughout, and the various features are not necessarily drawn to scale. In this description, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a multi-level power conversion system 100, which in one example includes an integrated circuit (IC) 101 with a converter circuit 102. The IC 101 includes an output node 104 (e.g., IC pin or pad) to deliver an output signal, such as an output voltage signal VO to drive a connected load. The example IC 101 includes an input node 106 (e.g., IC pin or pad) to receive an input signal, such as an input voltage signal VIN. In the illustrated example, the conversion system 100 is a DC-DC converter. When powered, the system 100 converts an input signal VIN at an input node 106 to provide an output signal, such as a voltage output signal VO, to an output node 104. In one example, the converter circuit 102 operates to regulate the output voltage VO according to a reference signal or value REF, which can be an internal reference or can be provided to an output control circuit in the IC 101. The converter circuit 102 includes a switching circuit with transistor switches connected between the input node 106 and a reference voltage node 108 (e.g., a ground reference). The switching circuit is connected to provide a switching node signal to a switching node 110, such as a switching node voltage signal VSW.

The converter circuit 102 in FIG. 1 is a three-level converter that includes switches 112 (labeled Q1), 114 (labeled Q2), 116 (labeled Q3) and 118 (labeled Q4) coupled in a series circuit between the input node 106 and the reference voltage node 108. The switches 112, 114, 116 and 118 operate according to switching control signals SC1, SC2, SC3 and SC4, respectively, to provide a voltage signal VSW to the switching node 110. In other examples, the converter circuit 102 can include more or fewer switches to provide an N-level converter, where N is greater than 2. In the illustrated example, the converter circuit switches 112, 114, 116 and 118 are n-channel MOSFET (e.g., NMOS) transistors operative to turn on according to a corresponding active high switching control signal. In other examples, different transistor switches can be used (e.g., PMOS, bipolar, IGBTs). The first switch 112 in FIG. 1 includes a drain connected to the input node 106 and a source connected to the first internal node 122. The third switch 116 includes a drain connected to the internal node 122, and a source connected to the switching node 110. The fourth transistor 118 includes a drain connected to the switching node 110, and a source connected to the second internal node 124. The second transistor 114 includes a drain connected to the second internal node 124, and a source connected to the reference voltage node 108. The multi-level converter circuit 102 also includes a capacitor 120, referred to herein as a flying capacitor (labeled CFLY). The capacitor 120 is connected between a first internal node 122 and a second internal node 124 of the switching circuit. In one example, the IC 101 includes the flying capacitor 120 as shown in FIG. 1. In another example, the IC 101 includes pins or pads (not shown) to allow connection of an external flying capacitor 120.

The power conversion circuit 100 also includes an inductor 126 coupled between the switching node 110 and the output node 104. In the illustrated example, the IC 101 includes externally accessible pins or pads for connection to the terminals of the inductor 126, including a pin connected to the switching node 110, and a pin or pad connected to the output node 104. In other examples, the inductor 126 can be included in the integrated circuit 101. The configuration of the switching circuit and the inductor 126 provides a buck-type DC-DC converter to provide a controlled output voltage signal VO at the output node 104 by converting input power from the input voltage signal VIN. In the illustrated system 100, an output capacitor 128 (labeled CO) is connected between the output node 104 and the reference voltage node 108, and the output signal VO drives a load 130, (labeled ZL).

The system 100 provides closed loop regulation of the output signal VO according to a feedback signal VFB from a resistive voltage divider circuit formed by divider resistors 132 and 134. The resistors 132 and 134 are connected in series with one another between the output node 104 and the reference voltage node 108, and the feedback signal VFB is created at a center node joining the resistors 132 and 134. In other possible implementations, the voltage feedback signal can be taken directly from the output node 104 (VO), and the control set point or reference (REF in FIG. 1) is scaled accordingly. In some examples, the IC 101 includes a current sensor 135 that senses an inductor current IL flowing in the inductor 126, and provides a current sense feedback signal IFB. Also, the IC 101 includes a second resistive voltage divider circuit including resistors 136 and 138 of generally equal resistances to provide a signal VIN/2 representing half of the input voltage signal VIN.

The IC 101 also includes control circuitry 140, which provides the switching control signals SC1, SC2, SC3 and SC4 to operate the switches 112, 114, 116 and 118. In one example, the control circuitry 140 is implemented as analog circuits that implement the functions described herein. In another example, the control circuitry 140 includes one or more digital processing circuits, and converter circuits (not shown) to convert analog signals to digital signals and vice versa. In certain implementations, internal circuits schematically represented in the control circuitry 140 in FIG. 1 can be implemented, in whole or in part, as firmware or software-executed program instructions.

In one example, the control circuitry 140 includes four outputs collectively labeled 142 in FIG. 1 to provide the switching control signals to the switching circuit 102. In this example, the control circuitry 140 includes a pulse width modulation (PWM) circuit 144 that generates the switching control signals SC1, SC2, SC3 and SC4 with a controlled duty cycle to operate the switches 112, 114, 116 and 118 according to (e.g., in response to, or based upon) a duty cycle signal to control the switching node voltage signal VSW at the switching node 110. The controlled duty cycle is adjustable in different switching cycles. Also, switching states of the switching circuit switches 112, 114, 116 and 118 are adjustable in one or more intervals within the switching cycles.

The control circuitry 140 in FIG. 1 also includes an output control circuit 146 that controls the duty cycle of the switching control signals SC1, SC2, SC3 and SC4 that are generated by the PWM circuit 144. In the illustrated example, the output control circuit 146 includes an output 147 coupled to provide the duty cycle signal DC to the PWM circuit 144 to control the duty cycle of the switching control signals SC1, SC2, SC3 and SC4. The duty cycle represents a ratio or proportion of time in a given switching cycle during which certain converter switches 112, 114, 116 and/or 118 are turned on. In one example, the output control circuit 146 is an analog circuit, including comparators, signal amplifiers and other circuitry to generate an error signal based on the difference between the voltage feedback signal VFB and the reference (e.g., setpoint) signal REF. In certain examples, the output control circuit 146 also generates the duty cycle signal DC at least partially according to (e.g., at least partially in response to, or at least partially based upon) the inductor current feedback signal IFB.

The PWM circuit 144 in one example is an analog circuit with one or more comparators to selectively change the states of the switching control signals SC1, SC2, SC3 and SC4 between first and second states or values (e.g., high and low) in order to selectively turn the corresponding switches 112, 114, 116 and/or 118 on or off in a controlled fashion. In one example, the duty cycle signal DC is a value determined by an outer loop control function that represents the on-time of one or more of the switching control signals in a given switching cycle. In one example, the control circuitry 104 can generate a modulation signal as an analog signal having a voltage level corresponding to a duty cycle determined by the output control circuit 146 according to a closed-loop regulation or control function. For example, the output control circuit 146 implements a proportional-integral (PI) or proportional-integral-derivative (PID) closed loop control function to regulate the output signal VO according to the reference signal REF and one or more feedback signals (e.g., VFB, IFB). The comparators of the PWM circuit 144 compare a modulation voltage signal that corresponds to the duty cycle signal DC with a ramp signal RAMP from a ramp generator circuit 148. Any suitable ramp generator circuitry can be used, such as an RC network with a current source, a capacitor and a resistor (not shown), or an inductor current can be used. In further examples, the ramp generator circuitry 148 can be implemented by processor-executed program instructions in a digital domain. In one implementation, the PWM circuit comparators selectively change the states of one or more of the switching control signals SC1, SC2, SC3 and SC4 at the outputs 142 according to (e.g., in response to or based upon) an upward ramp signal RAMP transitioning above a modulation signal (not shown) that is derived from the duty cycle signal DC. In other implementations, one or more functions of the ramp generator circuit 148, the output control circuit 146 and/or the PWM circuit 144 can be implemented by a digital circuit, such as a microprocessor, programmable logic circuit, etc. For example, a digital logic circuit can generate a ramp value, and compare this to a modulation value derived from a closed loop control function implemented as processor-executed program instructions, and generate PWM signals that are provided to a driver circuit to generate the switching control signals at the outputs 142 in a given switching cycle. In one example, the control circuitry 140 generates the pulse width modulated switching control signals SC1, SC2, SC3 and SC4 in each of a series of consecutive switching cycles.

In one example, the control circuitry 140 implements a generally constant switching frequency control implementation in which each consecutive switching cycle has a constant duration, although not a strict requirement of all possible implementations. In the illustrated three-level converter example, each switching cycle includes a respective set of four intervals. In this example, the control circuitry 140 generates the pulse width modulated switching control signals SC1, SC2, SC3 and SC4 to define switching states of the switching circuit for each interval. The ramp generator circuit 148 has an output 149 that provides one or more ramp signals (labeled RAMP in FIG. 1) to the PWM circuit 144 in the given switching cycle 201. In one implementation, the ramp generator circuit 148 provides first and second ramp signals at the output 149.

The control circuitry 140 also controls or regulates the flying capacitor voltage VFLY across the flying capacitor 120, generally independently of the output control loop provided by the output control circuit 146. In one example, in response to the flying capacitor voltage being outside a non-zero voltage range, the control circuitry 140 provides two intervals with switching states that discharge the capacitor 120 in a given switching cycle, or provides two intervals 523 with switching states that discharge the capacitor 120 in the given switching cycle, according to whether the flying capacitor voltage VFLY is above the non-zero voltage range. The control circuitry 140 in FIG. 1 includes a state control circuit 150 coupled with the PWM circuit 144 to control connection of the switching control signals SC1, SC2, SC3, SC4 to the switches 112, 114, 116, 118 of the switching circuit. In operation, the state control circuit 150 controls the switching states of two intervals of the given switching cycle 201 according to the voltage VFLY across the capacitor 120. In response to the flying capacitor voltage moving outside the non-zero voltage range, the state control circuit 150 selectively changes the switching states in two intervals of a given switching cycle in order to influence the charging and/or discharging of the flying capacitor 120 independent of the output regulation of the output control circuit 146. The example control circuitry 140 resolves charge balance problems through inner loop flying capacitor voltage regulation for multi-level converters of three or more levels, without disturbing the output voltage or inductor current loop.

In the example of FIG. 1, the state control circuit 150 includes a hysteretic comparator circuit 152 that compares the flying capacitor voltage VFLY to a hysteretic range centered at a threshold value. In the example of FIG. 1, the control circuitry 140 monitors the flying capacitor voltage VFLY according to (e.g., in response to, or based upon) received signals VTOP and VBOT that represent the voltages at the top and bottom terminals of the flying capacitor 120 (e.g., the voltages at the internal nodes 122 and 124). In one example, the center of the voltage range is half the voltage of the input signal VIN (e.g., VIN/2). The comparator 152 has an output 154 that provides a signal to a decode logic circuit 156. An output 157 of the decode logic circuit 156 provides an input to an output switching circuit 158. In this example, the PWM circuit 144 provides a pulse width modulated signals PWM1, PWM2, PWM3 and PWM4 according to (e.g., in response to, or based upon) the duty cycle signal DC from the output control circuit 146 and the ramp signal or signals RAMP from the ramp generator circuit 148 The PWM circuit 144 provides the PWM signals PWM1-PWM4 as inputs to the switching circuit output switching circuit 158. Based on the output signal from the decode logic circuit 156, the output switching circuit 158 connects specific ones of the PWM signals PWM1-PWM4 to the gate control terminals of the switches 112, 114, 116 and 118 of the converter circuit 102 in each interval of each successive switching cycle. In the illustrated example, the switching cycles each include four intervals, and the PWM circuit 144 generates the PWM signals PWM1-PWM4 to implement closed-loop control of the output signal VO based on the reference signal REF and one or more feedback signals VFB and/or IFB.

The state control circuit 150 monitors the flying capacitor voltage VFLY, and provides the PWM signals PWM1-PWM4 directly as the switching control signals SC1-SC4, respectively, while the flying capacitor voltage VFLY remains in the range set by the hysteresis of the comparator 152. In this condition, the control circuitry 140 provides the switching state sequence including a state that discharges the capacitor 120 in one interval and a different switching state that charges the capacitor 120 in another interval of the given switching cycle. In response to the voltage VFLY exceeding (e.g., being greater than) the upper hysteresis range limit (e.g., a first threshold) in the given switching cycle 201, the state control circuit 150 redirects the PWM signals PWM1-PWM4 to provide the switching control signals SC1, SC2, SC3, SC4 to implement a switching state that discharges the capacitor 120 in at least two intervals of the given switching cycle. Also, in response to the voltage VFLY falling below the lower hysteresis range limit (e.g., being less than a second threshold), the state control circuit 150 redirects the PWM signals PWM1-PWM4 to provide the switching control signals SC1, SC2, SC3, SC4 to implement a switching state that charges the capacitor 120 in at least two intervals of the given switching cycle 201.

Figure 2:
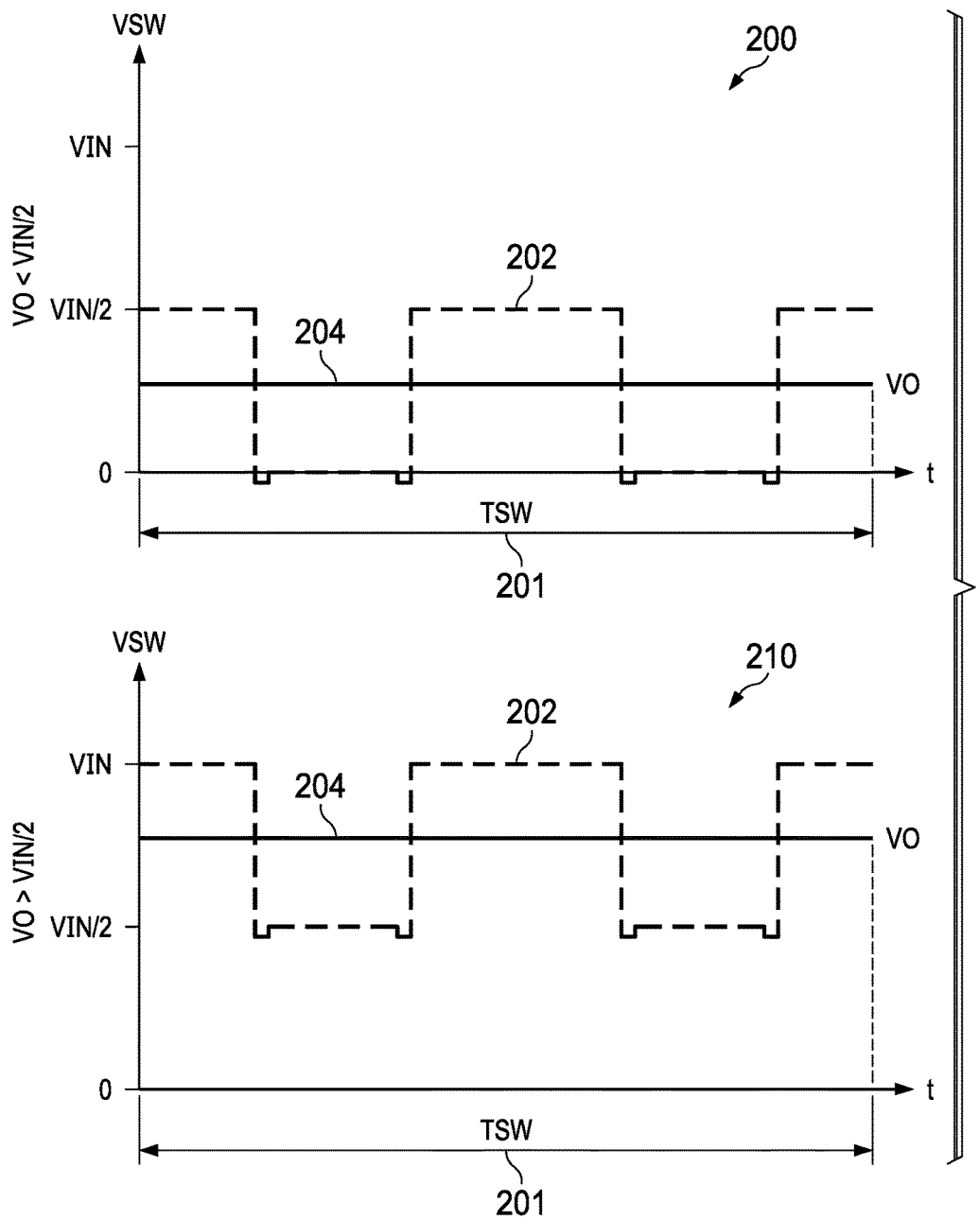
FIG. 2 shows graphs of switching node voltage for different levels of output voltage.

FIG. 2 shows graphs 200 and 210 of switching node voltage VSW for two different example levels of the output voltage signal. The graphs 200 and 210 illustrate two example steady state operating conditions in the system 100 of FIG. 1 when the control circuitry 140 regulates the switching control duty cycle (signal DC) to drive the voltage output signal VO to a level corresponding to the reference signal REF. The waveforms illustrated in FIG. 2 correspond to a three-level converter implementation. Different signal waveforms and switching states (not shown) can be used for other multi-level converter systems of higher orders (e.g., 4-level converters and above). The graph 200 shows a switching node voltage curve 202 (labeled VO) during an example switching cycle 201 with a total cycle period or duration TSW. The graph 200 shows two transitions of the switch node voltage signal VSW between approximately zero and VIN/2 in the four intervals of the example switching cycle 201 for an output voltage signal VO (curve 204) that is less than VIN/2. The graph 210 in FIG. 2 shows the switch node voltage and output voltage curves 202 and 204 for an example output voltage level above VIN/2. In this condition, the switch node voltage transitions twice between approximately VIN and VIN/2 in the example switching cycle 201. In one example, the control circuitry 140 provides the switching control signals SC1, SC2, SC3 and SC4, so that the switching cycles 201 have equal switching cycle durations TSW. In other implementations, the control circuitry 140 can vary the switching cycle durations TSW of successive switching cycles 201.

Figure 3:
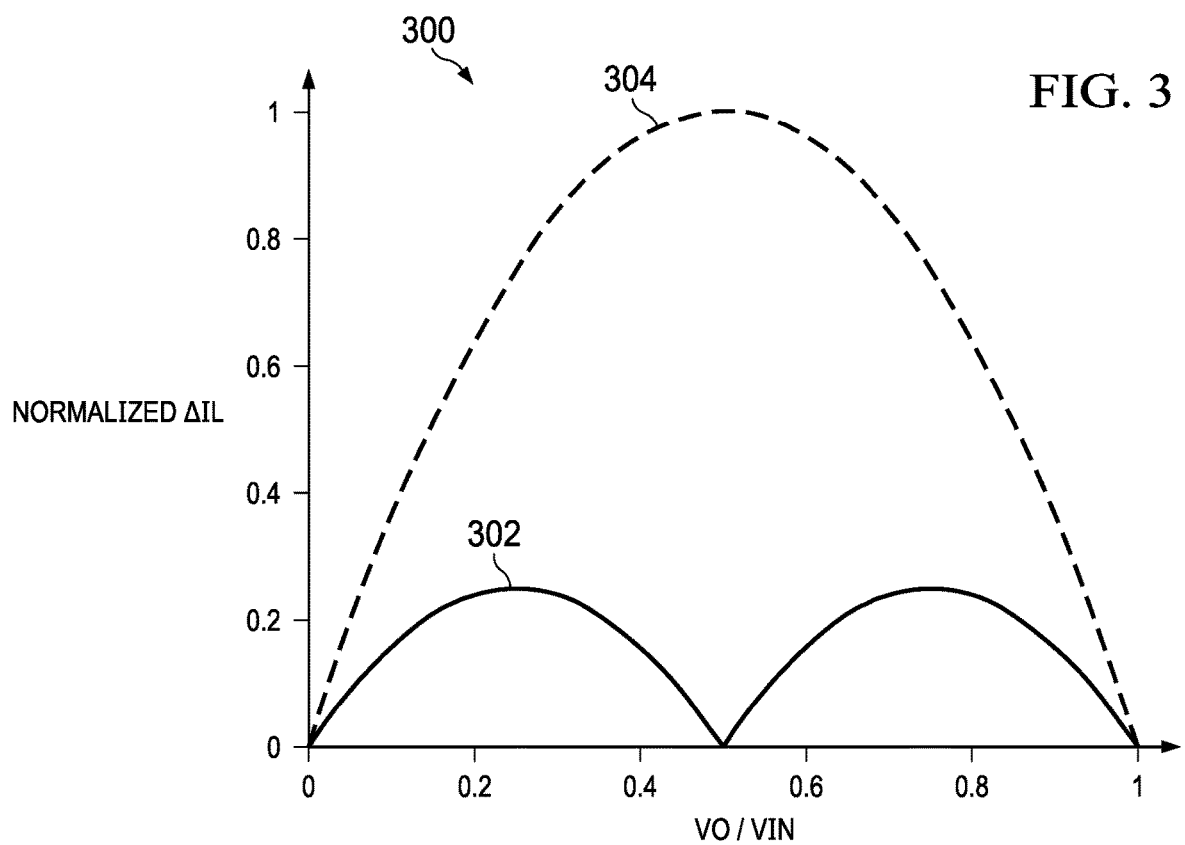
FIG. 3 is a graph of normalized inductor current ripple as a function of output voltage to input voltage ratio for a two-level buck converter and a three-level converter.

FIG. 3 shows a graph 300 with curves 302 and 304 of normalized inductor current change (labeled NORMALIZED ΔIL) as a function of output voltage to input voltage ratio VO/VIN. The curve 304 shows the normalized inductor current change for a two-level buck converter (not shown) and the curve 302 shows the normalized inductor current change for the example three-level converter in the system 100 of FIG. 1 for the same switching cycle duration. The three-level switch node toggles at twice the switching frequency compared to a single toggle for a two-level converter. In this manner, the inductor current ripple amount is reduced for the three-level converter implementation. The effective switching frequency doubles for the three-level converter (curve 302) compared with the two-level buck converter (curve 304). Also, the three-level converter (e.g., system 100 in FIG. 1) reduces the switching node voltage VSW by a factor of 2 compared with two-level buck converters. These two factors reduce the inductor current ripple by a factor of 4, allowing reduced switch transistor sizes and increased power density. Also, the described control circuitry 140 facilitates flying capacitor voltage control without disturbance of outer-loop regulation of the output signal VO. Described example multi-level converters facilitate output signal control in combination with the increased power density and other advantages of three or higher level power conversion systems.

Figure 4:
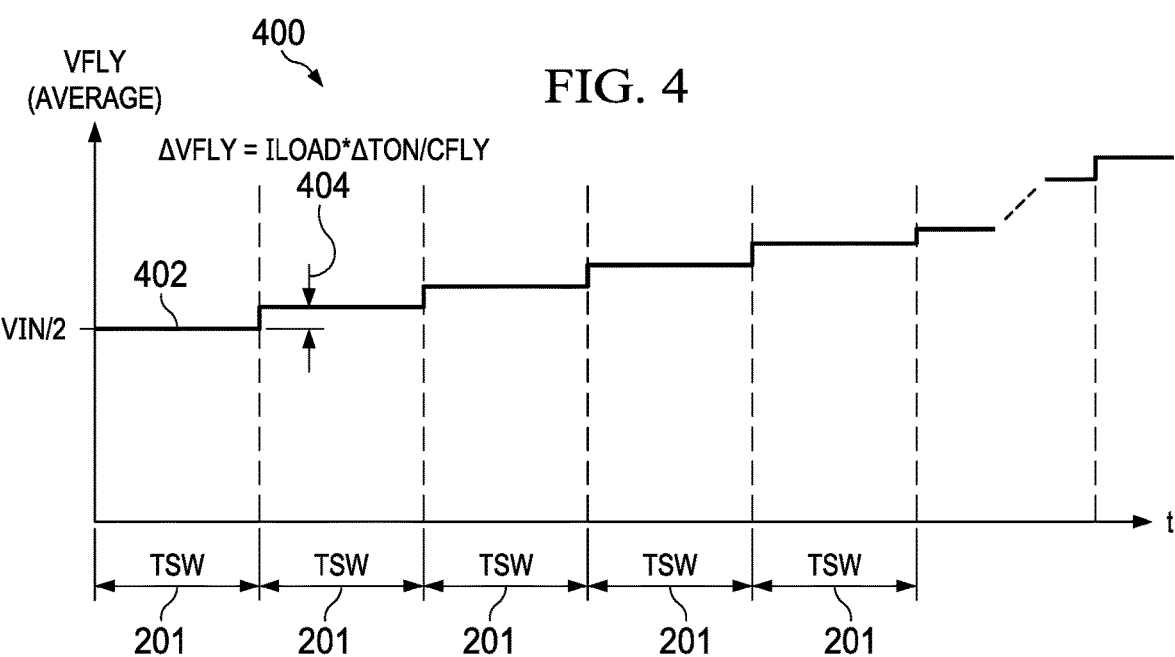
FIG. 4 is a graph of flying capacitor voltage as a function of time over several switching cycles.

FIG. 4 shows a graph 400 including a curve 402 of average flying capacitor voltage (e.g., capacitor voltage signal VFLY in FIG. 1) as a function of time over several switching cycles 201. In this example, the switching cycles 201 have equal duration TSW. The curve 402 illustrates an example of mismatch in on-time that causes drift in the flying capacitor voltage signal VFLY over successive switching cycles 201. In this example, on-time mismatch between charging and discharging states of the flying capacitor 120 in a given switching cycle leads to an offset in the flying capacitor voltage VFLY. The voltage offset ΔVFLY=ILOAD*ΔTON/CFLY represents the difference between the flying capacitor voltage and VIN/2, where ILOAD is the output load current of the power conversion system 100, ΔTON is the on-time mismatch between charging and discharging states and CFLY is the capacitance of the flying capacitor 120. Absent countermeasures, the offset is accumulated in successive switching cycles 201.

Figure 5:
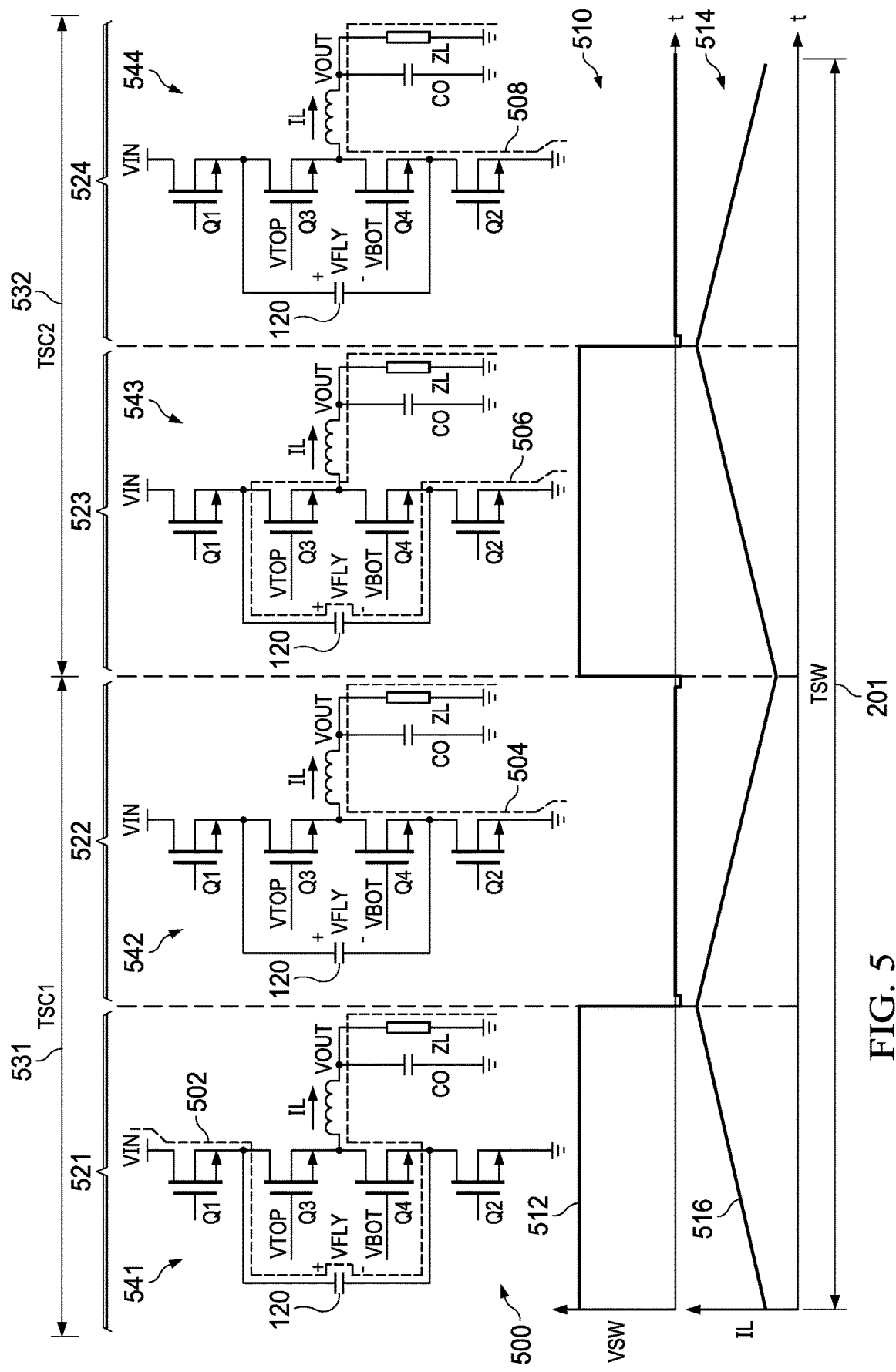
FIG. 5 is a graph of switch node voltage and inductor current in an example switching cycle in the power conversion system of FIG. 1.

FIG. 5 shows schematic representations 500 of four example switching states 541, 542, 543 and 544 of the converter circuit 102 in four example intervals 521, 522, 523 and 524 of an example switching cycle 201 in the power conversion system 100. The first and second intervals 521 and 522 form a first sub-cycle 531 with a duration TSC1. The third and fourth intervals 533 and 534 form a second sub-cycle 532 with a second duration TSC2. The example switching cycle 201 includes a first switching state 541 in the first interval 521 in which the control circuitry 140 turns Q1 and Q4 on, and turns Q2 and Q3 off. In this switching state 541, current flows along a path 502 from the input node 106 through Q1, the flying capacitor 120, Q4 and the output inductor 126. The first switching state 541 charges the flying capacitor 120. In the second switching state 542 of FIG. 5, the control circuitry 140 turns Q1 and Q3 off, and turns Q2 and Q4 on. The second switching state 542 causes current flow along a path 504 from the reference voltage node through Q2, Q4 and the output inductor. In the third switching state 543, the control circuitry 140 turns Q2 and Q3 on, and turns Q1 and Q4 off in the third interval 523. The third switching state 543 discharges the flying capacitor 120 with current flow along a path 506. In a fourth example switching state 544 in FIG. 5, the control circuitry 140 again turns Q1 and Q3 off, and turns Q2 and Q4 on to conduct current along a path 508. In this example, an on-time mismatch in the on time of the first and third switching states 541 and 543 in the respective intervals 521 and 523 can cause accumulated offsets in the flying capacitor voltage VFLY as shown in the example of FIG. 4 over successive switching cycles 201.

FIG. 5 also includes a graph 510 with a curve 512 that shows the switching node voltage signal VSW during the example switching cycle 201. Also, a graph 514 in FIG. 5 includes a curve 516 that shows the inductor current signal IL during the example switching cycle 201. As shown in FIG. 5, the switching cycle 201 includes a first sub-cycle 531 with a first sub-cycle duration TSC1 and a second sub-cycle 532 with a second sub-cycle duration TSC2. The first sub-cycle 531 includes a first interval 521 that corresponds to the first converter circuit switching state (current conduction path 502), and a second interval 522 that corresponds to the second converter circuit switching state (current conduction path 504). The second sub-cycle 532 includes a third switching cycle interval 523 that corresponds to the third switching state (current conduction path 506), and a fourth switching cycle interval 524 that corresponds to the fourth switching state (current conduction path 508).

Figure 6:
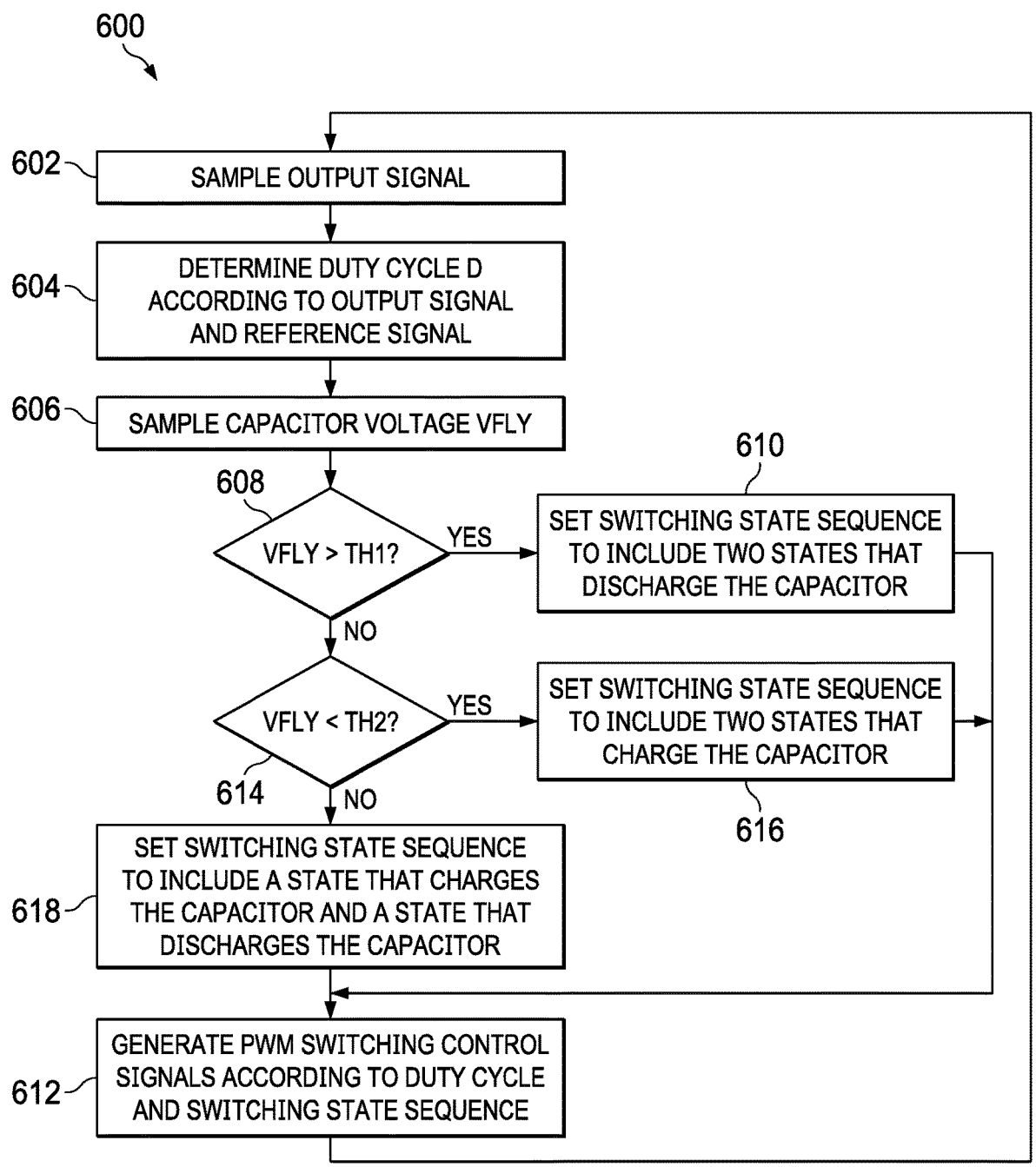
FIG. 6 is a flow diagram of a method of controlling a multi-level power conversion system.

FIG. 6 shows a method 600 of controlling a multi-level power conversion system, such as the system 100 in FIG. 1, for an example switching cycle 201. In one example, the control circuitry 140 in FIG. 1 is configured to implement the method 600. The method 600 includes sampling an output signal (e.g., VO and/or IL) at 602, and determining a duty cycle according to the sampled output signal and a reference signal at 604. In one example, the output control circuit 146 in FIG. 1 samples the output at 602 and determines the duty cycle at 604 to regulate the output voltage VO and minimize a difference between the setpoint reference signal REF and the output voltage feedback signal VFB. The method 600 further includes sampling the capacitor voltage (e.g., VFLY) at 606. In one example, the state control circuit 150 samples VFLY at 606.

At 608, the control circuitry 140 determines whether VFLY is greater than a first threshold TH1. If so (YES at 608), the method 600 continues at 610 by setting a switching state sequence for the given switching cycle 201 to include a switching state (e.g., 543 in FIG. 5) that discharges the capacitor 120 in at least two intervals of the given switching cycle 201. In one example, the decode logic circuit 156 in FIG. 1 sets the switching state sequence by controlling the output switching circuit 158 according to the comparator output. The process 600 continues at 612 with generating the switching control signals SC1-SC4 with a controlled duty cycle to operate the converter circuit switches 112, 114, 116 and 118. The process 600 then returns to 602 to begin the next switching cycle 201.

If the flying capacitor voltage VFLY does not exceed TH1 (NO at 608), the method 600 proceeds to 614, where the control circuitry 140 determines whether VFLY is less than a second threshold TH2. If so (YES at 614), the method 600 continues at 616, including setting thee switching state sequence to include a switching state (e.g., 541 in FIG. 5) that charges the capacitor 120 in at least two intervals of the given switching cycle 201. The control circuitry 140 generates the switching control signals SC1-SC4 according to the determined switching state sequence at 612.

If the flying capacitor voltage VFLY is in a non-zero range extending between TH1 and TH2 (NO at 614), the method continues at 618. In this case, the decode logic circuit 156 in FIG. 1 sets the switching state sequence at 618 to include a switching state (e.g., 543) that discharges the capacitor 120 in one interval and a switching state (e.g., 541) that charges the capacitor 120 in another interval of the given switching cycle 201.

Figure 7:
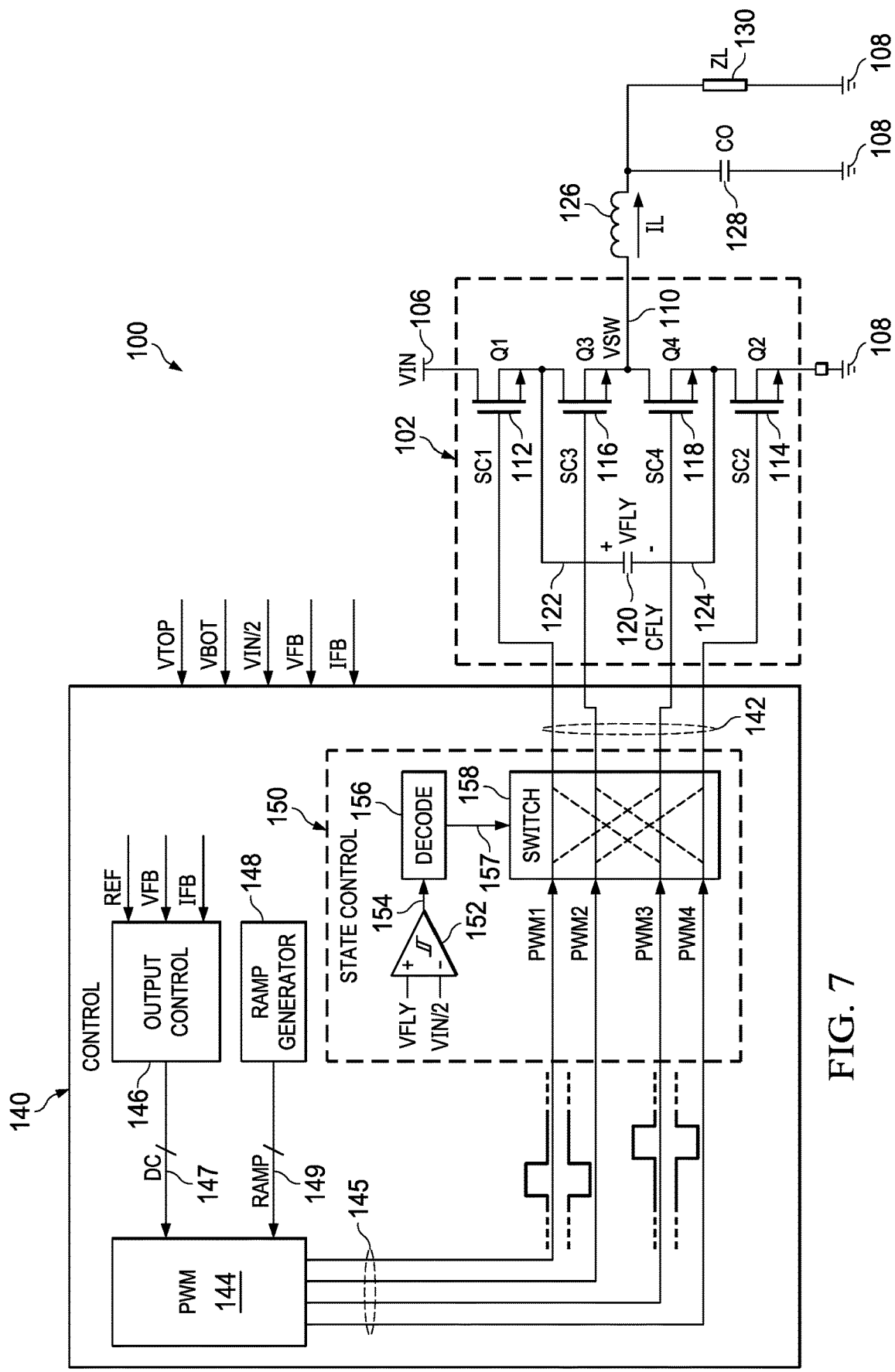
FIG. 7 is a schematic diagram of further details of example control circuitry in the multi-level power conversion system of FIG. 1.

FIG. 7 shows further details of one example control circuitry 140 which can be used in the multi-level power conversion system 100 of FIG. 1. In this example, the output switching circuit 158 generates the first switching control signal SC1 as either the first PWM signal PWM1 or the third PWM signal PWM3. The circuit 158 generates the switching control signals SC1 and SC2 according to the pulse width modulated signals PWM1 and PWM2, or according to PWM3 and PWM4 in response to the output 157 from the decode logic circuit 156. Also, the output switching circuit 158 in the example of FIG. 7 generates the switching control signals SC3 and SC4 according to the pulse width modulated signals PWM3 and PWM4, or according to PWM1 and PWM2 in response to the decode logic circuit output 157.

Figure 8:
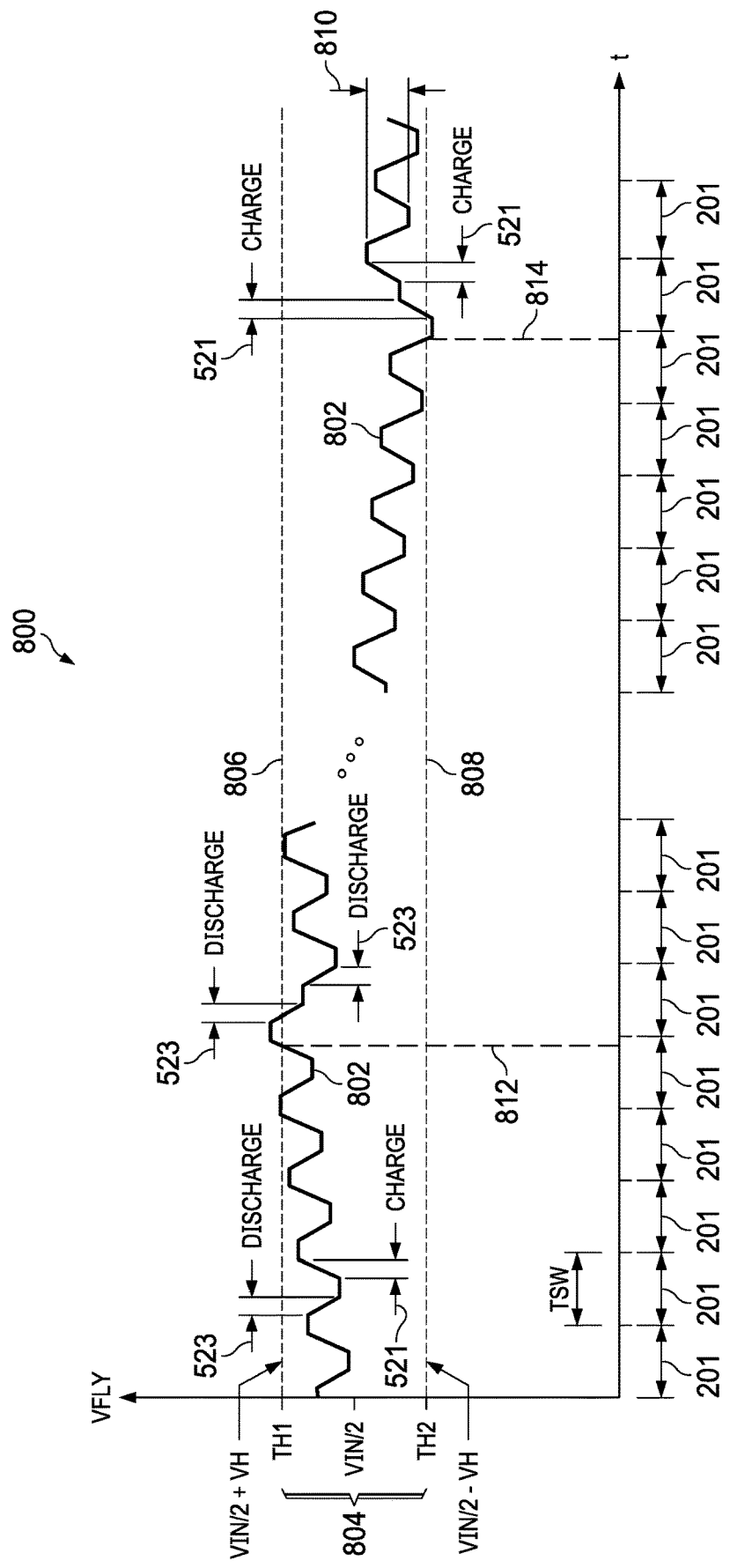
FIG. 8 is a graph of flying capacitor voltage in several example switching cycles, including double discharging or double charging cycles to control the flying capacitor voltage in the power conversion system of FIG. 1.

FIG. 8 includes a graph 800 that includes a curve 802 of flying capacitor voltage VFLY in several example switching cycles 201. The state control circuit 150 regulates the capacitor voltage VFLY to remain generally in a non-zero voltage range 804 that extends between, and includes, first and second threshold voltage limits 806 (e.g., VIN/2 plus a hysteresis voltage VH) and 808 (e.g., VIN/2−VH). In this example, the range 804 is greater than a ripple voltage 810 of the capacitor voltage VFLY. Also, the example range 804 is centered at half the input voltage (e.g., VIN/2). In normal cycles 201 in which VFLY is within the range 804, the four-interval switching state sequence includes one interval 523 that discharges the capacitor 120, and one interval 521 that charges the capacitor 120.

The example in FIG. 8 shows the capacitor voltage VFLY initially in the range 804, with a slight on-time imbalance that causes VFLY to gradually increase in successive switching cycles 201. At time 812, the capacitor voltage curve 802 transitions above the first threshold 806 (e.g., TH1). This condition is detected in the next cycle by the state control circuit comparator 152 in FIG. 1. In response, the state control circuit 150 provides the switching state sequence to include to two discharging states 543 in a single switching cycle 201. This reduces the capacitor voltage curve 802 sufficiently to avoid transitioning above the threshold 806 in the next switching cycle 201. If the curve 802 again transitions above the upper threshold 806, the state control circuit 150 generates another double discharging switching state sequence to again reduce the capacitor voltage VFLY.

The graph 800 shows another occurrence at time 814 where the capacitor voltage curve 802 transitions below the lower second threshold 808 (e.g., TH2). In response, the state control circuit 150 provides the switching state sequence to include to two charging states 541 in a single switching cycle 201. In the illustrated example, the double charging cycle moves the capacitor voltage curve 802 back within the range 804. The state control circuit 150 regulates the capacitor voltage VFLY with selective double charging or double discharging cycles as needed to quickly direct VFLY back within the range 804. Consecutive double charging or double discharging cycles are possible to control the flying capacitor voltage VFLY in the power conversion system 100. Described examples provide hysteretic control of VFLY with minimal effect on the output control loop or loops. Also, the circuitry 140 regulates VFLY quickly according to the polarity of voltage error on the flying capacitor 120. The state control circuitry 150 in certain examples is simple to implement, and requires less overhead circuitry compared to other techniques and acts in such a manner that it is orthogonal to other outer loops (e.g., output voltage and/or output current control loops). The described systems are useful in conjunction with three-level or higher order multi-level converters.

Modifications are possible in the described embodiments, and other embodiments are possible, within the scope of the claims.

What is claimed is:

1. A power conversion system, comprising:
a converter circuit, including:
a switching circuit including a first switch, a second switch, a third switch, and a fourth switch, each having a respective control input terminal, a respective first terminal, and a respective second terminal, the first terminals of the first and second switches are coupled together, the first terminals of the third and fourth switches are coupled together, and the second terminals of the second and third switches are coupled together; and
a capacitor having a first capacitor terminal coupled to the first terminals of the first and second switches and a second capacitor terminal coupled to the first terminals of the third and fourth switches;
an inductor having first and second inductor terminals, the first inductor terminal coupled to the second terminals of the second and third switches; and
control circuitry coupled to the respective control input terminals of the first through fourth switches and coupled to the first and second capacitor terminals, the control circuitry including:
a first control circuit configured to generate control signals to regulate an output signal at the second inductor terminal, wherein a duty cycle of the control signals is controlled based on a first comparison between a reference signal and a feedback signal, wherein the feedback signal is based on the output signal;
a second control circuit configured to selectively provide the control signals to the first through fourth switches such that a capacitor signal across the capacitor is regulated based on a second comparison of the capacitor signal to first and second thresholds; and
wherein the control signals are generated for a switching cycle having intervals, and the second control circuit is configured to selectively provide the control signals such that:
the capacitor is discharged in two intervals of the switching cycle responsive to the capacitor signal exceeding the first threshold; or
the capacitor is charged in two intervals of the switching cycle responsive to the capacitor signal being less than the second threshold; or
the capacitor is charged in one interval and discharged in another interval of the switching cycle responsive to the capacitor signal falling between the first threshold and the second threshold.

2. The power conversion system of claim 1, wherein the capacitor signal is a voltage across the capacitor, and a difference between the first and second thresholds is greater than a ripple voltage amount of the voltage across the capacitor.

3. The power conversion system of claim 1, wherein the switching cycle has four intervals.

4. The power conversion system of claim 1, wherein the feedback signal is a voltage feedback signal, the power conversion system includes a current sensor coupled to the first inductor terminal, and the first control circuit is configured to:
control the duty cycle of the control signals based on a feedback current received from the current sensor.

5. The power conversion system of claim 1, wherein the first control circuit includes:
an output control circuit configured to perform the first comparison to generate a duty cycle signal to control the duty cycle; and
a pulse width modulation (PWM) circuit configured to generate, as the control signals and responsive to the duty cycle signal, PWM signals having the duty cycle.

6. The power conversion system of claim 1, wherein an average of the first threshold and the second threshold is half an input voltage provided at the first switch.

7. The power conversion system of claim 1, wherein the capacitor signal is a voltage across the capacitor, and the second control circuit includes:
a comparator circuit configured to compare the voltage across the capacitor to the first and second thresholds to generate a signal used to selectively provide the control signals to the first through fourth switches.

8. The power conversion system of claim 1, wherein the first control circuit is configured to generate four pulse width modulation (PWM) signals as the control signals, and the second control circuit is configured to selectively provide the PWM signals without changing the duty cycle.

9. Control circuitry, comprising:
a first control circuit including:
an output control circuit configured to perform a first comparison of a reference signal to a feedback signal, wherein the feedback signal is based on an output signal from a power conversion system, and the output control circuit configured to generate a duty cycle signal based on the first comparison; and
a pulse width modulation (PWM) circuit configured to generate first, second, third, and fourth PWM signals during a switching cycle having intervals, the PWM signals having a duty cycle based on the duty cycle signal; and
a second control circuit configured to selectively provide the PWM signals such that a voltage across a capacitor of the power conversion system is regulated based on a second comparison of the voltage across the capacitor to first and second thresholds; and
wherein the second control circuit is configured to selectively provide the PWM signals such that:
the capacitor is discharged in two intervals of the switching cycle responsive to the voltage across the capacitor being greater than the first threshold;
the capacitor is charged in two intervals of the switching cycle responsive to the voltage across the capacitor being less than the second threshold; and
the capacitor is charged in one interval and discharged in another interval of the switching cycle responsive to the voltage across the capacitor falling between the first threshold and the second threshold.

10. The control circuitry of claim 9, wherein a difference between the first and second thresholds is greater than a ripple voltage amount of the voltage across the capacitor.

11. The control circuitry of claim 9, wherein the switching cycle has four intervals.

12. The control circuitry of claim 9, wherein the feedback signal is a voltage feedback signal, and the first control circuit is configured to control the duty cycle of the PWM signals based on a feedback current through an inductor of the converter circuit.

13. The control circuitry of claim 9, wherein an average of the first threshold and the second threshold is half of an input voltage of the power conversion system.

14. The control circuitry of claim 9, wherein the second control circuit includes:
a comparator circuit configured to compare the voltage across the capacitor to the first and second thresholds to generate a signal used to selectively provide the PWM signals.

15. A method comprising:
generating control signals for a switching cycle having intervals, the control signals having a duty cycle to regulate an output signal of a power conversion system having four switches coupled in series and having a capacitor coupled to the four switches, wherein the duty cycle is controlled based on a first comparison between a reference signal and a feedback signal, wherein the feedback signal is based on the output signal;
performing a second comparison of a voltage across the capacitor to first and second thresholds;
generating a comparison output signal based on the second comparison;
selectively providing the control signals to the switches, responsive to the comparison output signal, to regulate the voltage across the capacitor;
discharging the capacitor in two intervals of the switching cycle responsive to the voltage across the capacitor being greater than the first threshold;
charging the capacitor in two intervals of the switching cycle responsive to the voltage across the capacitor being less than a second threshold; and
charging the capacitor in one interval of the switching cycle and discharging the capacitor in another interval of the switching cycle responsive to the voltage across the capacitor falling between the first threshold and the second threshold.

16. The method of claim 15, wherein generating the control signals includes generating four pulse width modulated signals.

17. The method of claim 15, wherein the feedback signal is a voltage feedback signal, the method further comprising:
receiving a feedback current from an inductor of the power conversion system; and
controlling the duty cycle of the control signals based on the feedback current.

* * * * *